(12) United States Patent　　(10) Patent No.: US 9,179,573 B1
Lundquist et al.　　(45) Date of Patent: Nov. 3, 2015

(54) RACK-MOUNTED MULTIPLE SERVER MODULE

(71) Applicant: Black Rock Hosting Inc., Mesa, AZ (US)

(72) Inventors: Michael Lundquist, Mesa, AZ (US); Jon E. Vance, Phoenix, AZ (US)

( * ) Notice: Subject to any disclaimer, the term of this patent is extended or adjusted under 35 U.S.C. 154(b) by 127 days.

(21) Appl. No.: 14/039,529

(22) Filed: Sep. 27, 2013

(51) Int. Cl.
　　*G06F 1/16*　　(2006.01)
　　*H05K 7/14*　　(2006.01)

(52) U.S. Cl.
　　CPC .................... *H05K 7/1492* (2013.01)

(58) Field of Classification Search
　　CPC .................... G06F 1/187; G06F 1/16
　　USPC ..................................... 361/679.33
　　See application file for complete search history.

(56) References Cited

U.S. PATENT DOCUMENTS

| | | | |
|---|---|---|---|
| 6,654,241 B2 | 11/2003 | Hillyard et al. | |
| 7,193,847 B2 | 3/2007 | Liang et al. | |
| 7,791,890 B2* | 9/2010 | Ishida | 361/727 |
| 8,089,754 B2* | 1/2012 | Peng et al. | 361/679.48 |
| 8,369,092 B2* | 2/2013 | Atkins et al. | 361/727 |
| 2003/0200345 A1* | 10/2003 | Ramsey et al. | 709/253 |
| 2004/0062002 A1* | 4/2004 | Barringer et al. | 361/687 |
| 2007/0195496 A1* | 8/2007 | Wu et al. | 361/683 |
| 2007/0247804 A1 | 10/2007 | Li et al. | |
| 2008/0100992 A1 | 5/2008 | Fiora et al. | |
| 2012/0020008 A1* | 1/2012 | Dunwoody et al. | 361/679.46 |
| 2012/0020780 A1 | 1/2012 | Uchiyama et al. | |
| 2012/0050986 A1* | 3/2012 | Riebel | 361/679.48 |
| 2012/0136978 A1 | 5/2012 | Lou et al. | |
| 2013/0152376 A1* | 6/2013 | Corddry et al. | 29/592.1 |
| 2013/0163169 A1* | 6/2013 | Chuang et al. | 361/679.4 |

* cited by examiner

*Primary Examiner* — Forrest M Phillips
(74) *Attorney, Agent, or Firm* — Thomas W. Galvani, P.C.; Thomas W. Galvani

(57) ABSTRACT

A multiple server module includes a server chassis having a bottom, and a plurality of independently-operating, single-board computer servers arranged across the bottom of the server chassis. Each server has a compact footprint on the bottom which is defined by a motherboard alone, and each server includes a solid-state storage device, a processor, a networking port, and a power port carried on the motherboard within the footprint.

20 Claims, 4 Drawing Sheets

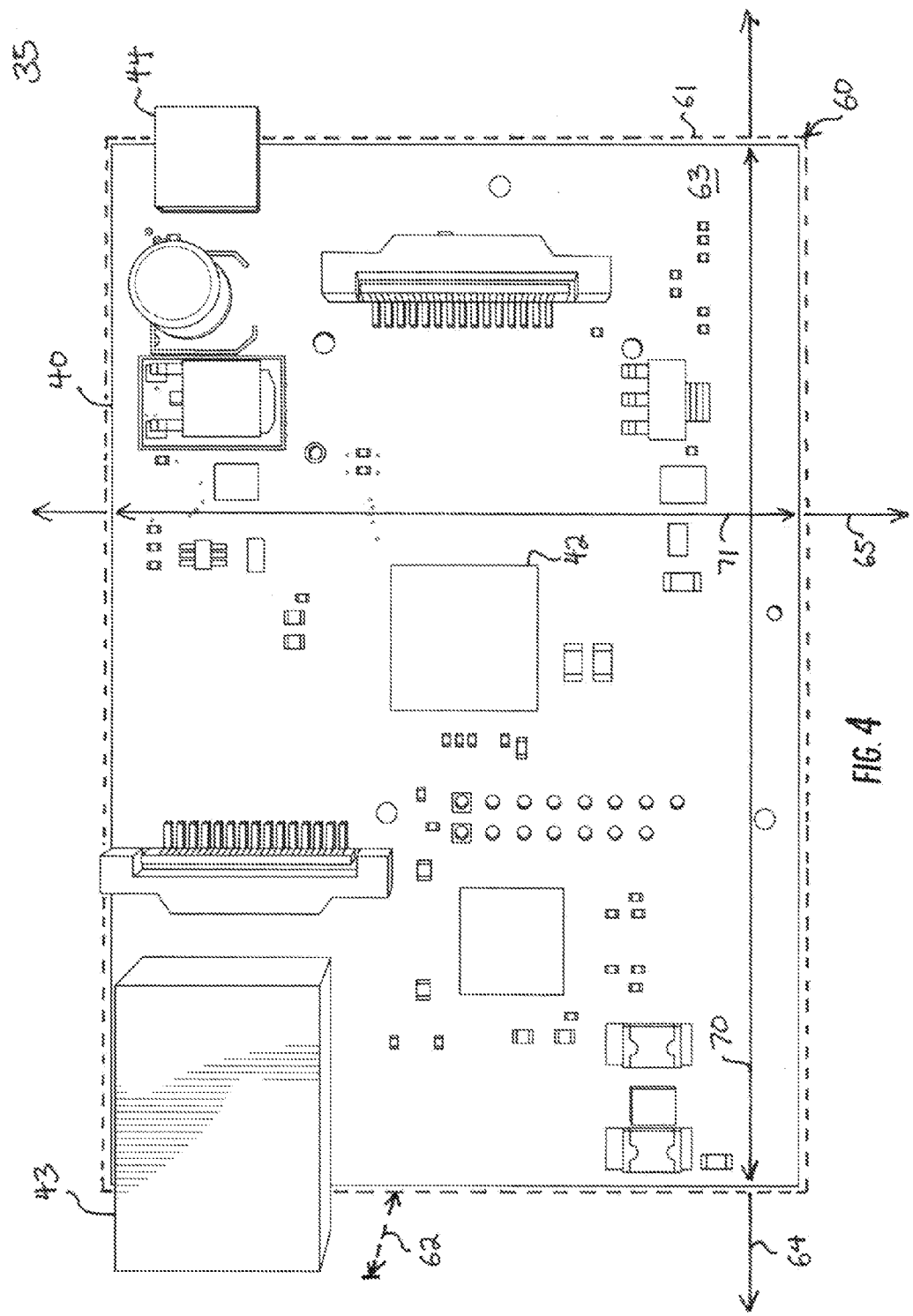

RACK-MOUNTED MULTIPLE SERVER MODULE

FIELD OF THE INVENTION

The present invention relates generally to computers, and more particularly to computer server rack systems.

BACKGROUND OF THE INVENTION

For over 50 years, computers have been stored in 19-inch racks in data centers and server rooms to move their bulk out of the home and office. 19-inch racks, or more simply, "racks," are frames or enclosures that house and support multiple computers. Most frequently, these computers are servers, providing remote hosting and processing of data for a client that is not local. The servers are frequently dedicated to performing a single or very few operations, and because of this specificity of operation, often have the capability to work at a faster or more efficient pace than a general-purpose computer would be able.

Arranging servers in racks saves space and can help organize equipment, peripherals, and accessories within dedicated data centers. A rack is several feet tall and 19 inches wide. It generally has four upright support members standing vertically at corners of the rack and has an open front and open back. Individual servers are secured within the rack horizontally, such as by coupling ears at the front of the server to the front two support members, or by sliding the servers on rails extending horizontally along the sides of the rack. The open front and back allow air to move through the rack, and also allow technicians to monitor and repair the servers. Servers will frequently have a front display providing status signals or other information which can be seen at the open front, and will generally route power and networking cables out the back through the open back of the rack.

Data centers and server rooms are refrigerated and kept very cool. The hard disk drives in the servers produce heat, and the motherboards and the processors also do to a limited extent. The servers have fans inside the server cases to expel heat from the case as fast as possible. The heat generated is significant, and when hundreds or thousands of servers are kept in a single room, the heat generated is tremendous. Unfortunately, servers operate poorly at heat and can fail much faster and more frequently than when they are kept cool. For this reason, data centers will refrigerate their rooms centrally, providing cooling to all of the servers in all of the racks. The cost of cooling rooms is not insignificant and contributes to the overhead of maintaining a data center. This cost is passed along to the client.

Stacking computer servers vertically also allows data centers to consolidate equipment into a small space, thus saving on land costs. To save more space, some people have developed stackable servers that can fit closely together, almost in interlocking arrangement. Others have developed servers that are positioned vertically, so that many thin servers can be placed alongside each other in a rack. This leads to a dense configuration of computers, however, and with it, difficult cooling problems. When servers are tightly packed, it can become challenging to dissipate heat quickly when there is little room for airflow among the servers. An improved rack server is needed.

SUMMARY OF THE INVENTION

According to the principle of the invention, a multiple server module includes a server chassis having a horizontal plane, and a plurality of independently-operating, single-board computer servers arranged across the horizontal plane. Each server has a compact footprint in the horizontal plane which is defined by a motherboard alone, and each includes a solid-state storage device, a processor, a networking port, and a power port carried on the motherboard within the footprint. The motherboard has a major face, and each server in the multiple server module is mounted with the major face of its motherboard parallel to the horizontal plane of the server chassis. Further, each footprint has an area less than eight square inches. The server chassis has a width to height ratio that is at least nine to one.

BRIEF DESCRIPTION OF THE DRAWINGS

Referring to the drawings:

FIG. 4 is an enlarged top plan view of an individual server from the multiple server module of FIG. 1.

DETAILED DESCRIPTION

Figure 1:
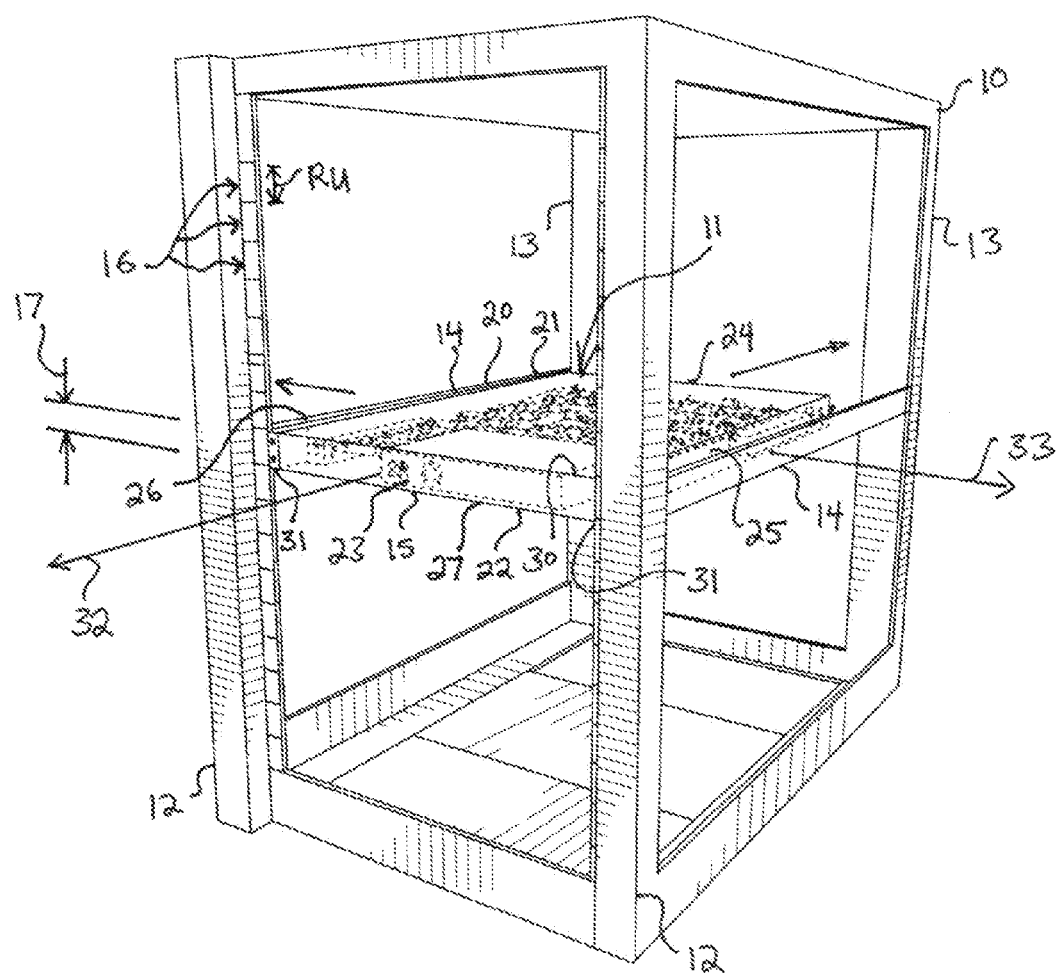
FIG. 1 is a front perspective view of a rack applied with a rack-mounted, thin-profile multiple server module constructed and arranged in accordance with the principle of the invention.

Reference now is made to the drawings, in which the same reference characters are used throughout the different figures to designate the same elements. FIG. 1 illustrates a computer rack 10 fitted with a rack-mounted, thin-profile multiple server module 11 (hereinafter referred to as "MSM") constructed and arranged in accordance with the principle of the invention. The rack 10 is a conventional rack with a frame assembly having two front corners 12, two rear corners 13, and rails 14 extending between the front and rear corners 12 and 13. The MSM 11 is mounted on the rails 14 for slidable application into and out of the rack 10. The rack 10 has a large number of horizontal spaces or bays 15 available to receive a conventional server or a MSM 11. These bays 15 are horizontally-oriented, and each has a height of one rack unit ("1RU"), a measurement which is conventionally accepted as being 1.75 inches (4.445 centimeters). As seen in FIG. 1, each bay 15 having a 1RU height is marked with upper and lower hash marks so that a series of hash marks are formed on the front corners 12 from the top to the bottom of the rack 10, each pair of hash marks designating a 1RU-sized bay 15. As such, the rack 10 can accommodate a single MSM 11, two MSMs 11, or a large number of MSMs 11.

The MSM 11 has a chassis 16 including a case 20, and a top 21, bottom 22, front 23, back 24, and opposed sides 25 and 26. The chassis has a height 17 which extends between the top 21 and bottom 22. For purposes of orientation, the side 25 is considered a right side, and the side 26 is considered a left side. The front 23, back 24, and the sides 25 and 26 cooperate to define a perimeter 30 that extends continuously around the MSM 11. The bottom 22 is a horizontal plane 27 extending between the front 23 and back 24 and the sides 25 and 26. The horizontal plane 27 is generally parallel to the ground on which the rack 10 is placed. The case 20 cooperates with the chassis 16 to enclose the MSM 11. The chassis 16 is a structural support for the MSM 11, and is constructed out of a material or combination of materials that has material characteristics of low density, strength, and rigidity, such as aluminum or like materials. The MSM 11 is secured to the rack 10 at ears 31 which project outwardly at the front 23 on each of the sides 25 and 26. The ears 31 are bolted or hooked onto fastener locations in the bay 15. Further, the MSM 11 has rails which slidably engage onto the rails 14 of the rack 10, which support the sides 25 and 26 between the front corners 12 and rear corners 13 of the rack 10.

Referring still to FIG. 1, the MSM 11 is generally rectangular prismatic and has a long axis 32 and a short axis 33. The long axis 32 extends between the front 23 and back 24 and is parallel to the sides 25 and 26. The short axis 33 extends between the sides 25 and 26 and is parallel to the front 23 and back 24. The long and short axes 32 and 33 are each parallel to the horizontal plane 27. The sides 25 and 26 are long, coextensive, and parallel with respect to each other, with a length of approximately 25 inches (approximately 63.5 centimeters). The front and back 23 and 24 are coextensive and parallel with respect to each other, each with a width of approximately 17 inches (approximately 43.2 centimeters).

Figure 2:
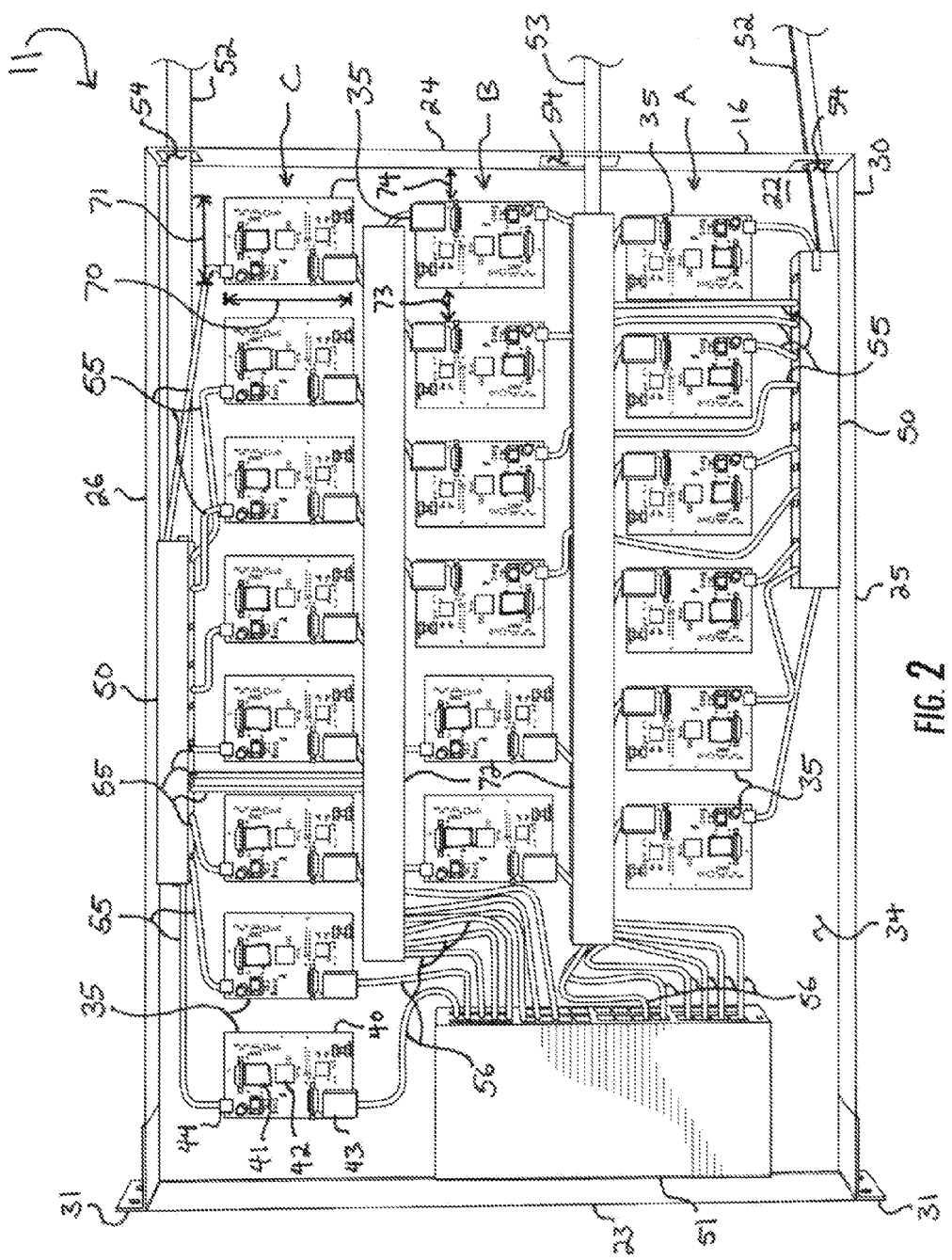
FIG. 2 is a top plan view of the multiple server module of FIG. 1 with a case removed to expose an interior of the multiple server module and a plurality of compact footprint servers within the multiple server module.

FIG. 2 illustrates the MSM 11 in an enlarged top plan view, with the case 20 removed to expose an interior 34 of the MSM 11 so that the internal components of the MSM 11 can be seen. In operation, the case 20 is installed on the chassis 16 to enclose the MSM 11 and prevent the intrusion of dust into the MSM 11.

Figure 3:
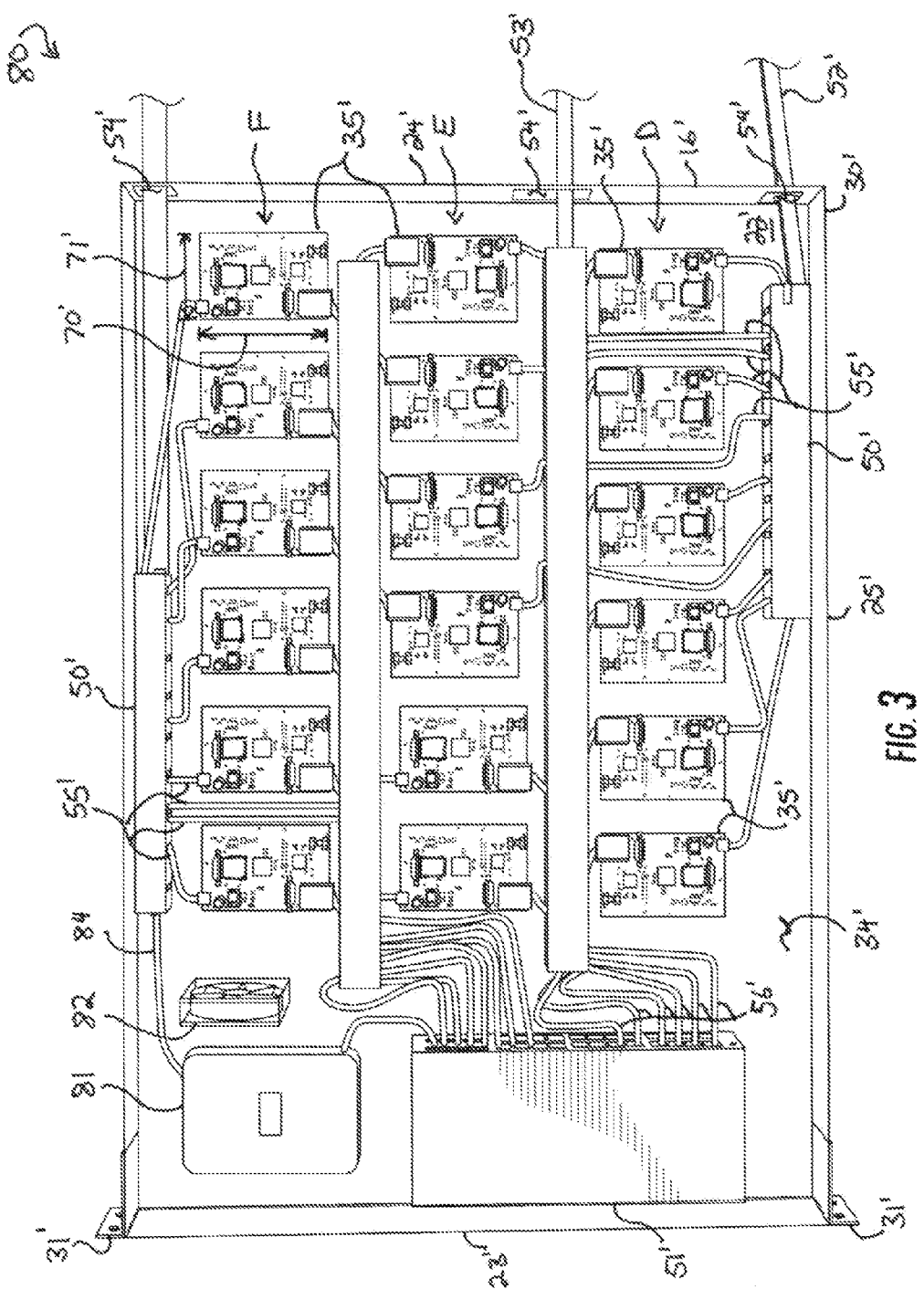
FIG. 3 is a top plan view of an embodiment of the multiple server module of FIG. 1 with a case removed to expose an interior of the multiple server module and a plurality of compact footprint servers within the multiple server module.

The MSM 11 includes a plurality of low-profile servers 35 arranged across the bottom 22 of the chassis 16. Shown here is an embodiment of the MSM 11 which has twenty individual servers 35. FIG. 3 illustrates an embodiment which has eighteen individual servers 35. Each server is an independently-operating single-board computer, capable of receiving data, processing data, and transmitting data according to a client-issued request or set of pre-programmed instructions. Each server 35 is thus capable of operating as a host computer or some other computer independent of the other servers 35, so that within an MSM 11, for example, one server 35 is a dedicated web host, another server 35 is a dedicated FTP host, another server 35 is a dedicated processing computer, another is a database host, and so on. Each server 35 can be configured to operate as separate processing components of a clustered computer, thus providing dedicated, separated processing functionality to a computer performing one or multiple tasks. Each of the servers 35 is identical to the others, and as such, detailed description will be presented only as to one of the servers 35 proximate to the ear 31 near the front 23 and the side 26. It will be understood that although reference characters are placed only on that server 35, each of the other servers 35 have identical components oriented and coupled in an identical fashion.

Still referring to FIG. 2, the server 35 has a motherboard 40, a solid-state storage device 41, a processor 42, a networking port 43, and a universal series bus ("USB") power port 44. The server 35 includes other components not specifically identified and referenced here, which a person having reasonable skill in the art will appreciate as being conventional components of a computer. The server 35 also has paths or traces etched into the motherboard 40 which electrically connect various components of the motherboard 40 to each other. The traces are not shown in the drawings since printed circuit board design is well understood in the art, and because inclusion of the traces in the drawings would lead to cluttered, crowded drawings which would be difficult to read.

The MSM 11 has two power supplies 50 and a networking switch 51. The two power supplies 50 are located apart from each other on opposed sides 25 and 26. The power supplies 50 are disposed on either side 25 and 26 to limit the number of wires extending throughout and across the MSM 11. Power and data cables 52 and 53 extend into the MSM 11 at the back 24 of the MSM 11 through ports 54 formed through the chassis 16. The power cables 52 provide power to each of the power supplies 50, which in turn distribute power to each of the servers 35 via power wires 55 that are coupled to the USB power ports 44 on the server 35. Similarly, the data cables 53 transmit networking data to and from the networking switch 51 which in turn distributes and receives the networking data to and from the servers 35 via networking wires 56 that are coupled to the networking ports 43 on the servers 35. The networking switch 51 is disposed at the front 23 of the MSM 11 and is disposed against the chassis 16. The front 23 of the MSM 11 may include small holes corresponding to indicator lights on the networking switch 51 so that the indicator lights can be seen from the front 23 of the MSM 11 and thus from the front of the rack 10. In this way, an operator can quickly determine the networking status of the MSM 11 by observing the indicator lights.

Referring now to FIG. 4, the server 35 has a form factor 60 which is small. The form factor 60 is the size and dimensioning of the server 35. The form factor 60 of the server 35 is characterized by a footprint 61 and a height 62 extending upward from the footprint 62. The footprint 61 is indicated in broken line encircling the motherboard 40. The height 62 is indicated in a double-arrowed broken line proximate to the networking port 43. The height 62 is received between the top 21 and bottom 22 of the chassis 16.

The motherboard 40 has a major face 63 which is wide and broad, and defines the footprint 61. The footprint 61 has a major axis 64 and a minor axis 65, and the major face 63 of the motherboard 40 has a length 70 extending along the major axis 64 and a width 71 extending along the minor axis 65. The major axis 64 of the footprint 61 is parallel to the short axis 33 of the MSM 11, and the minor axis 65 of the footprint 61 is parallel to the long axis 32 of the MSM 11. Likewise, the length 70 of the major face 63 is parallel to the short axis 33 of the MSM 11, and the width 71 of the major face 63 is parallel to the long axis 32 of the MSM 11. The length 70 of the major face 63 is greater than the width 71. The server 35 fits entirely within the footprint 61. The length 70 of the major face 63 is approximately 3.5 inches (8.89 centimeters) and the width 71 of the major face 64 is approximately 2.25 inches (Y 5.72 centimeters), and so the major face 63 and the footprint each have an area of approximately 7.9 square inches (50.9 square centimeters).

The components on the server 35 define the height 62 of the server 35. Generally, the height 62 is low and small in comparison to the length 70 and width 71 of the server 35. The USB power port 44 is the tallest component on the sever 35 and has a height less than 1RU, so that the server 35 has a low profile in which the height 62 of the server 35 is less than 1RU.

Turning back to FIG. 2, each server 35 is mounted on its respective footprint 61 with the major face 63 of the motherboard 40 parallel to the bottom 22 and the horizontal plane 27 of the chassis 16. The low-profile servers 35 are thus mounted across the chassis 16 in a thin-profile arrangement, defined by the major face 63 parallel to the chassis 16 bottom 22 and the horizontal plane 27. This thin-profile arrangement allows a plurality of servers 35 to be placed within a single enclosed MSM 11 having a height 17 just less than 1RU. No fan is necessary to cool the servers 35, as would be necessary in other servers, because the servers 35 include solid state devices and have no moving parts and generate little heat. The production of such little heat allows a plurality of servers 35 each with a compact form factor 60 to be disposed within a single enclosure without a fan. Any heat produced transfers by thermal conduction to the chassis 16 and off the MSM 11, while other conventional server systems rely on heat transfer by convection or radiation with a fan. In some embodiments, the MSM 11 may have a heat sink on the interior 34 or the exterior of the MSM 11 to draw heat off the MSM 11 more rapidly than without. The MSM 11 contains all of the servers 35 arranged horizontally across the bottom 16 of the chassis 22, with no server 35 extending higher than 1RU, and with the case 20 cooperating with the chassis 16 to define the height 17 of the MSM 11 which is less than 1RU, giving the MSM 11 a thin profile characterized by a length and width which are each much greater than the height 17 of the MSM 11. The width to height ratio of the MSM 11 is approximately 9.7:1, with the width of the MSM 11 being 17 inches and the height being 1.75 inches. The length to height ratio of the MSM 11 is approximately 14.3:1, with the length of the MSM 11 being 25 inches and the height 17 being 1.75 inches. The thin-profile characteristic of the MSM 11 is defined by this width to height ratio of at least 9 to 1 and this length to height ratio of at least 14:1.

The servers 35 are arranged generally in a grid having three rows. In FIG. 2, there are three rows A, B, and C. Row A is proximate to the side 25 of the MSM 11, row C is proximate to the side 26 of the MSM 11, and row B is located generally intermediately with respect to rows A and B and with respect to sides 25 and 26. Rows A and B each contain six servers 35, and row C contains eight servers 35. Each server 35 is set back from the perimeter 30, and the servers 35 are spaced apart laterally from each other by a distance 73 equivalent to approximately and at least half the width 71 of the server 35. Further, each server 35 is set back from the perimeter 30 by a distance 74 equivalent to approximately and at least half the width 71 of the server 35. Rows A and B have fewer servers 35 than row C because the networking switch 51 is disposed at the end of rows A and B. The networking switch 51, and the data cables 56 extending from the networking switch 51, occupy room on the chassis 16 bottom 22 at the end of rows A and B.

The rows A, B, and C are spaced apart from each other. Two raceways 72 extend substantially the length of the MSM 11 between the front 23 and back 24, with one raceway 72 between rows A and B, and another raceway 72 between rows B and C. Each raceway 72 has two sides, a top, and opposed open ends. Both the power and networking wires 55 and 56 are routed through the raceways 72 to avoid cluttering the interior 34 of the MSM 11.

FIG. 2 illustrates an alternate embodiment of a multiple server module, reference there as MSM 80. MSM 80 is identical in every respect to MSM 11, and as such, the same reference characters used to identify the various features and elements of MSM 11 are used to identify identical features and elements of MSM 80 and are designated with a prime ("'") symbol so as to distinguish the features and elements of MSM 80 from those of MSM 11. As such, MSM 80 includes a chassis 16', height 17', case 20', top 21', bottom 22', front 23', back 24', sides 25' and 26', a perimeter 30', ears 31', a long axis 32', a short axis 33', an interior 34', a plurality of servers 35' each with a motherboard 40', solid-state storage device 41', processor 42', networking port 43', USB power port 44', a power supply 50', a networking switch 51', power cables 52', data cables 53', ports 54', power wires 55', networking wires 56', form factors 60', footprints 61', heights 62', major faces 63', major axes 64', minor axes 65', lengths 70', widths 71', and raceways 72'. The MSM 80 includes spaced-apart rows D, E, and F of server 35'. Row D is proximate to the side 25', row F is proximate to the side 26', and row E is located in a generally intermediate position with respect to rows D and F and with respect to the sides 25' and 26'. Rows D and E each contain six servers 35'. Row F also contains six severs 35', unlike the eight servers 35 of row C in MSM 11. Row F terminates short of the front 23' to form space for a hard disk drive 81 and a fan 82. In other embodiments, the hard disk drive 81 is mounted to the exterior of the MSM 11 to leave space on the bottom 22' of the chassis 16' for additional servers 35'. The hard disk drive 81 is a storage device independent from the servers 35', but is coupled to each of the servers 35' through the networking switch 51'. A networking wire 83 couples the hard disk drive 81 to the networking switch 51' in data communication. A power wire 84 provides power to the hard disk drive 81 from the power supply 50'. The hard disk drive 81 is useful for storing large amounts of data for any of the servers 35' for more than transient or temporary amounts of time, may be used as an expanded random access memory for any of the servers, or may store historical operational information about the MSM 80. The fan 82 is a small case fan directed to move air over the servers 35' within the MSM 80 between the servers 35' and the top 21' of the chassis 16'. The fan 82 receives power from the power supply 50' through the power wire 84.

The present invention is described above with reference to a preferred embodiment. In another embodiment according to the principle of the invention, the height 17 of the MSM 11 is greater, such as equivalent to two rack units ("2RU") or three rack units ("3RU"). In a 2RU embodiment of the MSM 11, the MSM 11 has an internal horizontal median plane located generally intermediately between the top 21 and bottom 22 of the chassis 16. The median plane extends between the front 23 and back 24 and between the sides 25 and 26. The median plane carries a plurality of servers 35 for increased hosting and processing power. The servers 35 are mounted to and arranged on the median plane in an identical fashion as the servers 35 are mounted to and arranged on the bottom 22. In the 2RU embodiment of the MSM 11, therefore, the bottom 22 of the chassis 16 is the horizontal plane 27 having one level of servers 35, and a second level of servers 35 is carried on the median plane between the top 21 and bottom 22.

In a 3RU embodiment of the MSM 11, the MSM 11 has internal, horizontal, first and second planes spaced apart from each other by a distance of 1RU and located generally intermediately between the top 21 and bottom 22 of the chassis. The first and second planes each extend between the front 23 and back 24 and between the sides 25 and 26. The first and second planes each carry a plurality of servers 35 for increased hosting and processing power for the MSM 11. The servers 35 are mounted to and arranged on each of the first and second planes in an identical fashion as the servers 35 are mounted to and arranged on the bottom 22. In the 3RU embodiment of the MSM 11, therefore, the bottom 22 of the chassis 16 is the horizontal plane 27 having one level of servers 35, and second and third levels of servers 35 are carried on the first and second planes between the top 21 and bottom 22.

Those skilled in the art will recognize that changes and modifications may be made in the described embodiments without departing from the nature and scope of the present invention. To the extent that such modifications and variations do not depart from the spirit of the invention, they are intended to be included within the scope thereof.

Having fully and clearly described the invention so as to enable one having skill in the art to understand and practice the same, the invention claimed is:

1. A multiple server module comprising:
    a server chassis having a horizontal plane; and
    a plurality of independently-operative single-board computer servers arranged across the horizontal plane of the server chassis, each server having a compact footprint in the horizontal plane defined by a motherboard alone and including a solid-state storage device, processor, a networking port, and a power port carried on the motherboard within the footprint.

2. The multiple server module of claim 1, wherein:
    the motherboard of each server has a major face; and
    each server is mounted to the server chassis with the major face of the motherboard of the server parallel to the horizontal plane of the server chassis.

3. The multiple-server module of claim 1, wherein each footprint of the servers has an area less than eight square inches.

4. The multiple server module of claim 1, wherein:
    the server chassis has a width;
    the server chassis has a height; and
    the ratio of the width to the height is at least nine.

5. The multiple server module of claim 1, further comprising:
    a power supply mounted within the server chassis and coupled to each of the servers; and
    a networking switch mounted within the server chassis and coupled to the networking port on each of the servers.

6. The multiple server module of claim 1, wherein:
    each server is set back from a perimeter edge of the server chassis by a distance equal half a width of the server; and
    each server is spaced apart from the other servers by a distance equal to half of the width of the server.

7. The multiple server module of claim 1, further comprising a hard disk drive separate from the servers and coupled to the networking switch and to the power supply.

8. The multiple server module of claim 1, wherein the multiple server module lacks a fan.

9. A multiple server module comprising:
    a server chassis; and
    a plurality of servers mounted to the server chassis; and
    the server chassis has a chassis height corresponding to one rack unit;
    wherein in an applied condition of the multiple server module in a server rack, the multiple server module occupies no more vertical space of and with respect to the server rack than the chassis height.

10. The multiple server module of claim 9, further comprising:
    a top and opposed bottom of the server chassis;
    each server has a compact form factor defined by a motherboard of the server; and
    each form factor is characterized by a footprint, corresponding to a major face of the motherboard, and a height, corresponding to components carried on the motherboard;
    wherein the servers are each arranged on respective footprints across the bottom of the server chassis, and the height of the form factor of each server is received between the top and bottom of the server chassis.

11. The multiple server module of claim 10, wherein all of the servers are spaced apart laterally across the bottom of the server with respect to each other.

12. The multiple server module of claim 9, wherein:
    each server includes a processor, solid state memory, a network interface, and a power port mounted to the motherboard;
    a power supply is mounted to the server chassis and coupled to each of the servers; and
    a networking switch is mounted to the server chassis and coupled to the networking port on each of the servers.

13. The multiple server module of claim 9, wherein the multiple server module lacks a fan.

14. The multiple server module of claim 9, wherein each server is set back from a perimeter edge of the server chassis.

15. A multiple server module comprising:
    a server chassis having a top and an opposed bottom; and
    a plurality of server modules in the server chassis, each server having a compact form factor defined by a motherboard of the server, the form factor characterized by a footprint corresponding to the motherboard;
    the servers are arranged on their respective footprints across the bottom of the server chassis; and
    between the top and bottom, the server chassis has a chassis height corresponding to one rack unit.

16. The multiple server module of claim 15, wherein all of the servers are arranged laterally across the bottom of the server chassis with respect to each other.

17. The multiple server module of claim 15, wherein:
    each server includes a processor, solid state memory, a network interface, and a power port mounted to the motherboard;
    a power supply is mounted to the server chassis and coupled to each of the servers; and
    a networking switch is mounted to the server chassis and coupled to the networking port on each of the servers.

18. The multiple server module of claim 15, further comprising a hard disk drive separate from the servers and coupled to the networking switch and to the power supply.

19. The multiple server module of claim 15, wherein the multiple server module lacks a fan.

20. The multiple server module of claim 15, wherein:
    each server is set back from a perimeter edge of the server chassis by a distance equal half a width of the server; and
    each server is spaced apart from the other servers by a distance equal to half of the width of the server.

* * * * *